United States Patent [19]

Mazzochette

[11] Patent Number: 5,986,516
[45] Date of Patent: Nov. 16, 1999

[54] CHIP ATTENUATOR HAVING A CAPACITOR THEREIN

[75] Inventor: Joseph B. Mazzochette, Cherry Hill, N.J.

[73] Assignee: EMC Technology LLC, Cherry Hill, N.J.

[21] Appl. No.: 08/998,672

[22] Filed: Dec. 29, 1997

[51] Int. Cl.⁶ .................................................. H01P 1/22
[52] U.S. Cl. .......................................... 333/81 A; 333/172
[58] Field of Search ................................ 333/81 A, 81 R, 333/172

[56] References Cited

U.S. PATENT DOCUMENTS

| | | | |
|---|---|---|---|
| 3,599,125 | 8/1971 | Yoshida | 333/81 A |
| 3,676,807 | 7/1972 | Boer | 333/81 A |
| 4,010,430 | 3/1977 | Wolfe | 333/81 A |
| 5,847,624 | 12/1998 | Pritchett | 333/81 R |

FOREIGN PATENT DOCUMENTS

| | | | |
|---|---|---|---|
| 195649 | 9/1986 | European Pat. Off. | 333/81 A |
| 84001 | 7/1981 | Japan | 333/81 A |
| 207001 | 9/1987 | Japan | 333/81 A |

*Primary Examiner*—Benny Lee
*Attorney, Agent, or Firm*—Donald S. Cohen

[57] ABSTRACT

An attenuator includes a flat, substantially rectangular substrate of an insulating material having a surface. A plurality of termination areas of a conductive material are on the substrate surface and are spaced from each other. Three resistors are on the substrate surface and are connected in a series parallel combination between the termination areas. The resistors may be formed by three separate resistance layers extending between and connected to the termination areas, or a single resistance layer extending between and connected to the termination areas. A shunt capacitor is on the substrate surface and is connected to one of the resistors. The shunt capacitor is formed by an area of a conductive material on the substrate surface and overlapping a portion of the resistors, and a dielectric layer between the conductive area and the resistor.

11 Claims, 3 Drawing Sheets

CHIP ATTENUATOR HAVING A CAPACITOR THEREIN

FIELD OF THE INVENTION

The present invention is directed to a chip attenuator, and, more particularly to a chip attenuator having improved frequency response.

BACKGROUND OF THE INVENTION

Chip attenuators are used in RF and microwave circuits to change signal level to act as buffers between amplifier stages to prevent oscillation, and for impedance matching for frequency selective devices such as filters or mixers. There are three typical constructions used to fabricate chip attenuators. Referring to FIG. 1, there is shown a top view of one type of a prior art chip attenuator 10, generally referred to as a "T" type chip attenuator. The attenuator 10 comprises a flat rectangular substrate 12 of an insulating material, such as a ceramic or plastic. On a surface 14 of the substrate 12 are first and second conductors 16 and 18 which are spaced apart. A third conductor 20 is on the surface 14 and extends between the first and second conductors 16 and 18. The third conductor 20 has a head 22 thereon at one end. A fourth conductor 24 is on the surface 14 and is spaced from and substantially parallel to the head 22 of the third conductor 20. A first resistor 26 is on the surface 14 and extends between the first and third conductors 16 and 20, and a second resistor 28 is on the surface 14 and extends between the second and third conductors 18 and 20. A third resistor 30 is on the surface 14 and extends between the head 29 of the third conductor 20 and the fourth conductor 24. Each of the conductors 16, 18, 20 and 24 are films of a thick or thin film conductive material, and each of the resistors 26. 28 and 30 are films of a thick or thin film resistance material. Thus, the "T" type attenuator comprises three resistors connected together.

Referring to FIG. 2, there is shown a second type of prior art chip attenuator 32, which is general referred to as a "Pi" type attenuator. Attenuator 32 comprises a flat, rectangular substrate 34 of an insulating material, having a surface 36. On the surface 36 are spaced first, second and third conductors 38, 40 and 42. Also, on the surface 36 are first, second and third resistors 44, 46 and 48. The first resistor 44 extends between the first and second conductors 38 and 40, the second resistor 46 extends between the first and third conductors 38 and 42, and the third resistor 48 extends between the second and third conductors 40 and 42. Thus, the attenuator 32 comprises three resistors connected in a series/parallel relationship.

Referring to FIG. 3, there is shown a third type of prior art chip attenuator 50, which is generally referred to as a "sheet" type attenuator. Attenuator 50 is similar to the "Pi" type attenuator 32 of FIG. 2 in that it comprises a flat, rectangular substrate 52 having a surface 54, and three spaced conductors 56, 58 and 60 on the surface 54. However, instead of three separate resistors, the "sheet" type attenuator 50 has a single resistance film 62 on the surface 54 and extending between the first, second and third conductors 56, 58 and 60. However, in essence, the single resistance film 62 forms a resistor extending between the first and second conductors 56 and 58, and a separate resistor extending between the third conductor 60 and each of the first and second conductors 56 and 58. Thus, the "sheet" type attenuator 50 provides the same resistor circuit as the "Pi" type attenuator 32.

The choice of which of the above types of attenuators is used depends on the desired power dissipation and frequency response. The "T" type attenuator 10 works well for attenuation values below 2 dB since the series resistors are larger and easier to fabricate. The "Pi" type attenuator 32 and the "sheet" type attenuator 50 work well for high attenuation value because the are two shunt resistors. However, a problem with all of these types of attenuators has to do with the small amount of inductance associated with the resistor geometry and connecting metal terminations. The inductance forms a series R-L circuit which behaves like a low pass filter. The effect of the inductance is a reduction in the attenuation with increasing frequency. The effect of the inductance on a "T" type attenuator 10 is much worse than on either a "Pi" type or "sheet" type attenuator. Therefore, the "Pi" type or "sheet" type attenuator is preferred. However, it would be desirable to further improve the performance of the "Pi" type, "sheet" type and "T" type attenuators.

SUMMARY OF THE INVENTION

The present invention is directed to an attenuator which includes three resistors connected in a series and/or parallel relation between three terminations. A shunt capacitor if formed at one of the resistors.

Another aspect of the present invention is an attenuator which includes a substantially flat, rectangular substrate of an insulating material having a surface. Spaced first and second termination areas of a conductive material are on the substrate surface. A third termination area of a conductive material is on the substrate surface spaced from the first and second termination areas. Resistors are on the substrate surface and extend between the termination areas to form two resistors connected in parallel and a third resistor connected in series with the other two resistors. A capacitor is on the substrate surface and is connected to the third resistor.

DETAILED DESCRIPTION OF PREFERRED EMBODIMENTS

Figure 4:
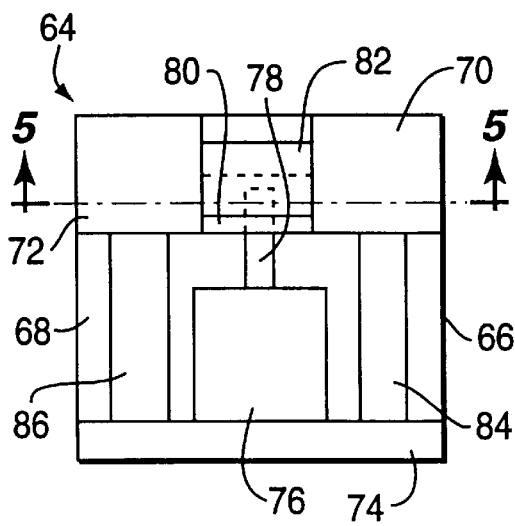
FIG. 4 is a top view of one form of the chip attenuator of the present invention.
Figure 5:
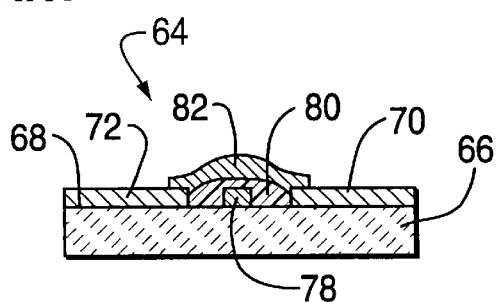
FIG. 5 is a sectional view taken along line 5—5 of FIG. 4.

Referring to FIGS. 4 and 5, one form of the attenuator of the present invention is generally designated as 64. Attenuator 64 comprises a flat, rectangular substrate 66 having a surface 68. The substrate 66 is of an insulating material such as a plastic or a ceramic. The substrate 66 may be of an epoxy-fiberglass, silicon, beryllium oxide or aluminum oxide. On the surface 68 of the substrate 66 are first and second spaced termination areas 70 and 72 of a conductive material. The termination areas 70 and 72 are shown to be in two corners of the surface 68. A third termination area 74 of a conductive material is on the surface 68 and extends as a strip alone one side of the surface 68 spaced from the first and second termination areas 70 and 72. A fourth termination area 76 of a conductive material is on the surface 68 and extends from the third termination area 74 toward the first and second termination areas 70 and 72. The fourth termination area 76 has a finger 78 extending therefrom into the space between the first and second termination areas 70 and 72. The termination areas 70, 72, 74, 76 and 78 are all of film of a conductive material, such as copper, silver, gold, nickel or other high conductivity material.

A layer 80 of a dielectric material is on the surface 68 in the space between the first and second termination areas 70 and 72 and extends over the finger 78 as shown in FIG. 5. Thus, at least a portion of the finger 78 is covered by the dielectric layer 80. A first resistor layer 82 (see FIGS. 4, 5) is on the surface 68 and extends between the first and second termination areas 70 and 72. The first resistor layer 82 extends over the dielectric layer 80 and over at least a portion of the finger 78 of the fourth termination area 76. A second resistor layer 84 is on the surface 68 and extends between the first termination area 70 and the third termination area 74 (see FIG. 4). A third resistor layer 86 (see FIG. 4) is on the surface 68 and extends between the second termination area 72 and the third termination area 74. The resistor layer 82, 84 and 86 may be of any well known resistance material, such as a thick film, thin film or other film type low conductivity material.

Figure 2:
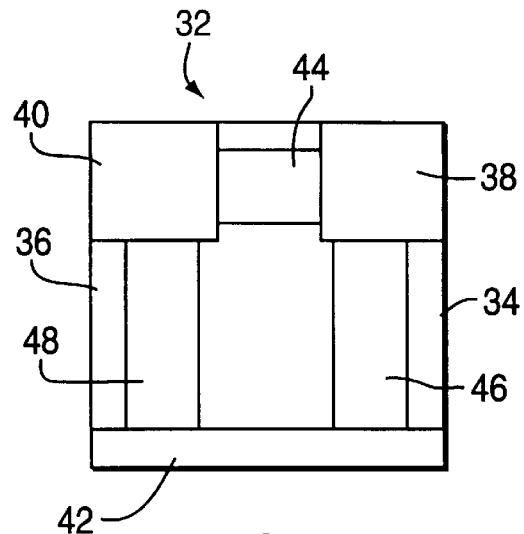
FIG. 2 is a top view of a second form of a prior art chip attenuator.
Figure 10:
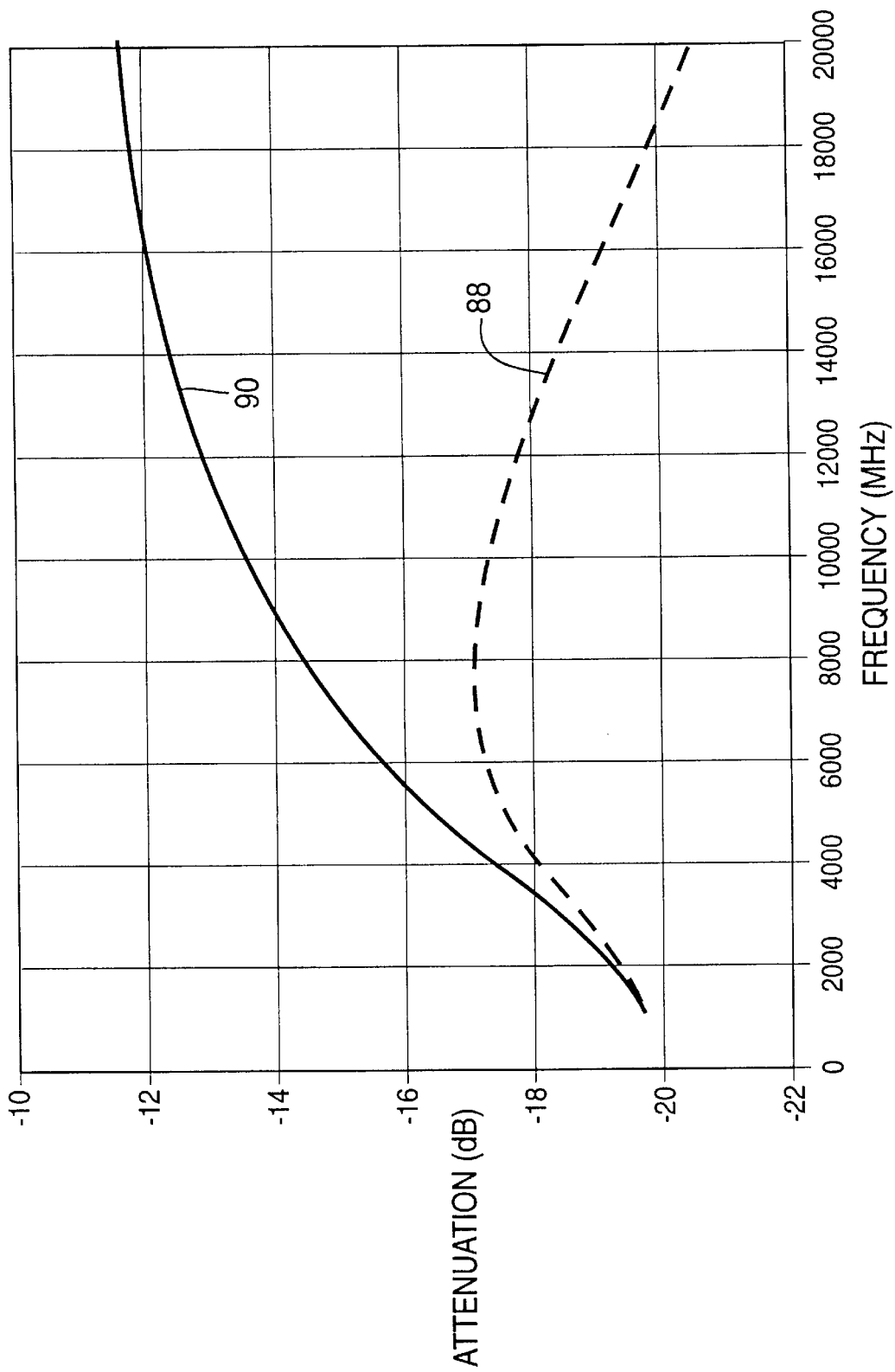
FIG. 10 is a graph comparing the attenuation vs. frequency of the attenuator of the present invention to that of the prior art attenuator.

Thus, the attenuator 64 is similar to the "Pi" type attenuator 32 shown in FIG. 2 in that it includes three resistors connected in series and parallel relation between three termination areas. However, as best seen in FIG. 5, the attenuator 64 of the present invention also includes a shunt capacitor formed by the first resistor 82, the dielectric layer 80 and the finger 78 of the fourth termination area 76. This shunt capacitor is in the center of the first resistor 82 which capacitor compensates for the inductance inherently formed in the attenuator. In FIG. 10, the dash line 88 shows the variation in attenuation with variations in frequency for the attenuator 64 of the present invention having a shunt capacitor. The solid line 90 shows the variation in attenuation with variation in frequency for the similar "Pi" type attenuator of FIG. 2 which does not have the shunt capacitor. It can be seen from FIG. 10 that the attenuator 64 of the present invention has a much smaller change in attenuation which variations in frequency than does the similar prior art "Pi" type attenuator. Thus, the attenuator 64 of the present invention has an improved attenuation over a wide range of frequencies.

Figure 6:
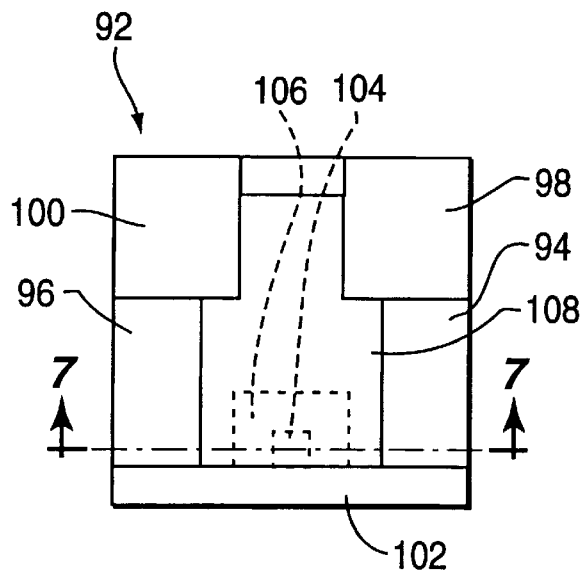
FIG. 6 is a top view of another form of the chip attenuator of the present invention.
Figure 7:
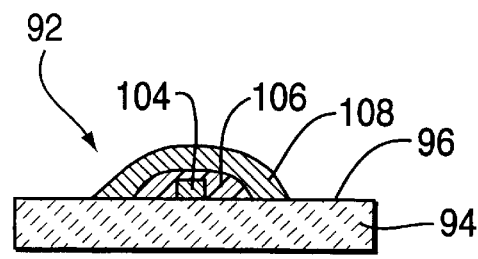
FIG. 7 is a sectional view taken along line 7—7 of FIG. 6.

Referring to FIGS. 6 and 7, another form of the attenuator of the present invention is generally designated as 92. Attenuator 92 comprises a flat, substantially rectangular substrate 94 of an insulating material having a surface 96. On the surface 96 of the substrate 94 are first and second spaced termination areas 98 and 100. As shown, the termination areas 98 and 100 are in two corners of the surface 96. A third termination area 102 is on the surface 96 and extends as a strip along a side of the surface 96 spaced from the first and second termination areas 98 and 100. A fourth termination area 104 is on the surface 96 and extends as a finger from the third termination area 102 toward the space between the first and second termination areas 98 and 100. The termination areas 98, 100, 102 and 104 are of a layer of a conductive material, such as a metal.

Figure 3:
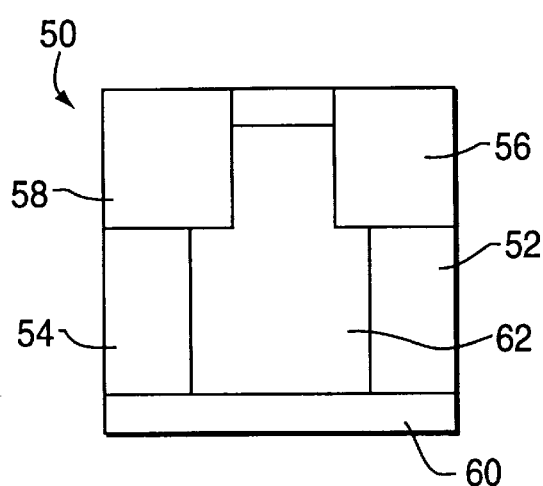
FIG. 3 is a top view of a third form of a prior art chip attenuator.

As shown in FIGS. 6 and 7, a layer 106 of a dielectric material is on the surface 96 and extends over the fourth termination area 104. A resistor layer 108 is on the surface 96 and extends between and contacts the first, second and third termination areas 98, 100 and 102. The resistor layer 108 also extends over the dielectric layer 106 and over the fourth termination area 104. The resistor layer 108 can be of any well known resistance material. Thus, the attenuator 92 is similar to the prior art "sheet" type attenuator 50 shown in FIG. 3 in that it includes three termination areas having a single resistor layer extending between the three termination areas to form three resistors in series and parallel relation. However, the attenuator 92 also includes a shunt capacitor formed by the fourth termination area 104, the dielectric layer 106 and the resistor layer 108. The shunt capacitor is in the middle of one of the resistors and serves to compensate for the inherent inductance in the attenuator. As described above with regard to the attenuator 64 of the present invention the shunt capacitor serves to improve the attenuation of the attenuator over a wide range of frequencies.

Figure 1:
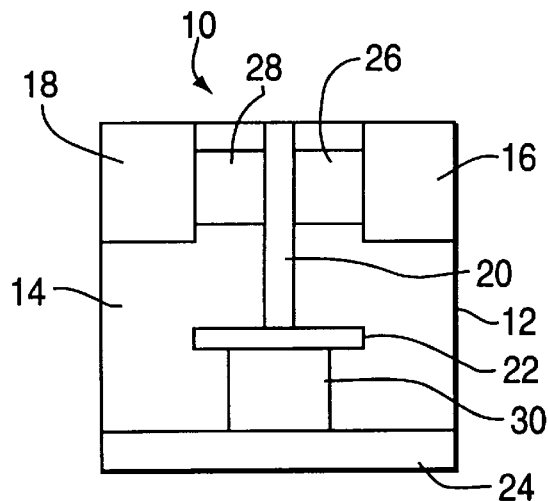
FIG. 1 is a top view of one form of a prior art chip attenuator.
Figure 8:
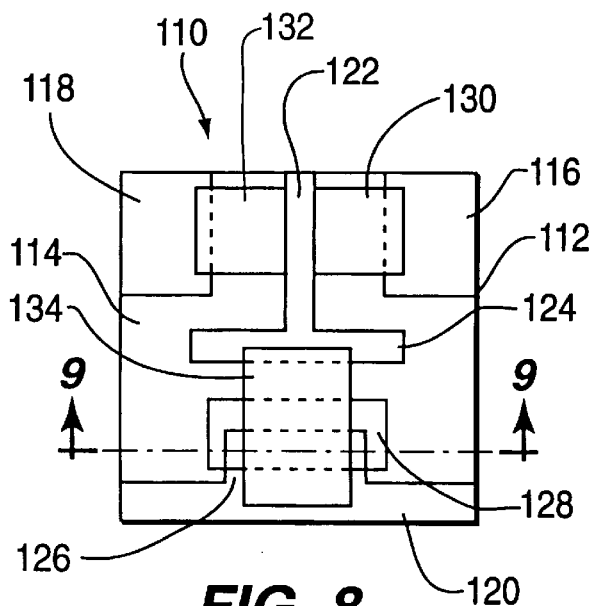
FIG. 8 is a top view of a third form of the chip attenuator of the present invention.
Figure 9:
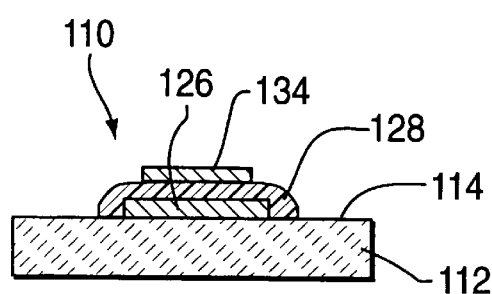
FIG. 9 is a sectional view taken along line 9—9 of FIG. 8.

Although the "T" type attenuator 10 shown in FIG. 1 is not the preferred one of the chip attenuators shown, its response can also be improved by the present invention. Referring now to FIGS. 8 and 9 an improved "T" type attenuator of the present invention is generally designated as 110. Attenuator 110 comprises a substantially flat, rectangular substrate 112 of an insulating material having a surface 114. On the substrate surface 114 are spaced first and second termination areas 116 and 118 of a conductive material. The first and second termination areas 116 and 118 are in opposite corners of the substrate surface 114. A third termination area 120 of a strip of conductive material is along a side of the substrate surface 114 spaced from the first and second termination areas 116 and 118. A fourth termination area 122 of a strip of conductive material extends between the first and second termination areas 116 and 118. The fourth termination area 122 has a head 124 at one end which is parallel to and spaced from the third termination area 120. The third termination area 120 has an area 126 of a conductive material extending therefrom toward the head 124 of the fourth termination area 122.

A layer 128 of a dielectric material is on the substrate surface 114 and covers a portion of the conductive area 126. A first resistor layer 130 is on the substrate surface 114 and extends between the first and fourth termination areas 116 and 122, and a second resistor layer 132 is oil the substrate surface 114 and extends between the second and fourth termination areas 118 and 122. A third resistor layer 134 is on the substrate surface 114 and extends between the third termination area 120 and the head 124 of the fourth termination area 122. The third resistor layer 134 extends over the dielectric layer 128 and the conductive area 126. The third resistor layer 134 is spaced from a portion of the conductive area 126 by the dielectric layer 128.

Thus, the attenuator 110 is similar to the "T" type attenuator 10 shown in FIG. 1 in that it includes three resistors connected in series parallel combination. However, the attenuator 110 includes a capacitor connected in series with one of the resistors. As can be seen in FIG. 9, the capacitor is provided by the conductive area 126 being one plate, the third resistor 134 being the other plate, and the dielectric layer 128 being the dielectric between the two plates. This capacitor compensates for any inductance to improve the frequency response of the attenuator.

The attenuators 64, 92 and 110 of the present invention can be made by first depositing the conductive layers forming the various termination areas. The dielectric layer can then be coated on the surface of the substrate and over the fourth termination area. Finally, the resistance layer or layers are deposited with at least one resistor layer extending over the dielectric layer and the fourth termination area to form the shunt capacitor. If desired, the resistance layer or layers can be deposited first, the dielectric layer second and finally the conductive layers forming the termination areas. This would form the capacitor with the fourth termination layer being over the dielectric layer and the resistor being beneath the dielectric layer.

Thus, there is provided by the present invention, a chip attenuator in which three resistors are formed on the surface of a substrate with the resistors between connected in a series parallel combination between three termination areas. A shunt capacitor is formed at the center of one of the resistors to improve the attenuation of the device over a wide range of frequencies.

What is claimed is:

1. An attenuator comprising:

a substantially flat rectangular substrate of an insulating material having a surface;

first, second, third and fourth spaced termination areas of a conductive material on the surface of the substrate;

three resistors on the substrate surface extending and electrically connected between three of the first, second, third and fourth termination areas; and a dielectric layer underlying one of the three resistors and overlying the fourth termination area to define a capacitor therebetween.

2. The attenuator of claim 1 in which first and second ones of the three resistors are respectively connected between a first termination area and separate second and third termination areas, and the third one of the three resistors is connected between the first termination area and the fourth termination area to define a T-type attenuator.

3. The attenuator of claim 2 in which the capacitor is provided between the fourth termination area and the third one of the three resistors.

4. The attenuator of claim 3 in which the fourth termination area has a conductive area extending therefrom, a layer of a dielectric material extends over at least a portion of the conductive area, and the third one of the three resistors extends over the dielectric layer to define the capacitor with the conductive area and the dielectric layer.

5. The attenuator of claim 1 in which first and second ones of the three said resistors are connected in parallel and are respective first and second resistance layers extending between each of said first and second termination areas and said third termination area, and the third one of the three resistors comprises a third resistance layer extending between the first and second termination areas to define a Pi type attenuator.

6. The attenuator of claim 5 in which the three resistors are portion of a single resistance layer on the substrate surface and extending between and contacting the first, second and third termination areas.

7. The attenuator of claim 6 in which the fourth termination area extends from the third termination area and overlaps the single resistance layer, with the dielectric layer being between the fourth termination area and the single resistance layer.

8. The attenuator of claim 7 in which the first and second termination areas are in corners of the substrate surface and the third termination area is a strip extending alone a side of the substrate surface spaced from the first and second termination areas.

9. The attenuator of claim 5 in which the dielectric layer extends between the third resistance layer and the fourth termination area.

10. The attenuator of claim 9 in which the fourth termination area extends from the third termination area toward a space between the first and second termination areas and a finger extends from the fourth termination area and overlaps the third resistance layer.

11. The attenuator of claim 10 in which the first and second termination areas are in corners of the substrate surface and the third termination area is a strip extending along a side of the substrate surface spaced from the first and second termination areas.

* * * * *